(12) United States Patent
Tian et al.

(10) Patent No.: US 10,325,933 B2
(45) Date of Patent: Jun. 18, 2019

(54) ARRAY SUBSTRATE AND MANUFACTURING METHOD THEREOF, DISPLAY DEVICE

(71) Applicant: BOE TECHNOLOGY GROUP CO., LTD., Beijing (CN)

(72) Inventors: Yunyun Tian, Beijing (CN); Hyunsic Choi, Beijing (CN); Yoonsung Um, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/503,980

(22) PCT Filed: Feb. 16, 2016

(86) PCT No.: PCT/CN2016/073874
§ 371 (c)(1),
(2) Date: Feb. 14, 2017

(87) PCT Pub. No.: WO2017/054394
PCT Pub. Date: Apr. 6, 2017

(65) Prior Publication Data
US 2017/0278868 A1 Sep. 28, 2017

(30) Foreign Application Priority Data

Sep. 28, 2015 (CN) .......................... 2015 1 0625592

(51) Int. Cl.
*H01L 27/12* (2006.01)
*H01L 21/77* (2017.01)
(Continued)

(52) U.S. Cl.
CPC .......... *H01L 27/124* (2013.01); *G02F 1/1368* (2013.01); *G02F 1/136286* (2013.01);
(Continued)

(58) Field of Classification Search
None
See application file for complete search history.

(56) References Cited

U.S. PATENT DOCUMENTS

2008/0001883 A1   1/2008  Kim et al.
2008/0043193 A1*  2/2008  Oke .................. G02F 1/134363
                                                        349/144
(Continued)

FOREIGN PATENT DOCUMENTS

CN    101097313 A    1/2008
CN    101373301 A    2/2009
(Continued)

OTHER PUBLICATIONS

Office Action in Chinese Application No. 201510625592.0 dated Aug. 1, 2017, with English translation.
(Continued)

*Primary Examiner* — Bo B Jang
(74) *Attorney, Agent, or Firm* — Womble Bond Dickinson (US) LLP

(57) ABSTRACT

The present disclosure provides an array substrate comprising a plurality of gate lines, and a plurality of data lines that intersect the plurality of gate lines. A plurality of pixel units are defined by the plurality of gate lines and the plurality of data lines which intersect each other. Each pixel unit comprises a thin film transistor, a gate insulating layer, a passivation layer arranged on one side of the gate insulating layer, a pixel electrode and a common electrode, wherein a source and a drain of the thin film transistor are arranged between the passivation layer and the gate insulating layer, the common electrode is arranged on the other side of the gate insulating layer opposite to the passivation layer, and the pixel electrode is arranged on the passivation layer. The
(Continued)

present disclosure further provides a method for manufacturing an array substrate and a display device.

11 Claims, 5 Drawing Sheets

(51) Int. Cl.
G02F 1/1362 (2006.01)
G02F 1/1368 (2006.01)
G02F 1/1343 (2006.01)
(52) U.S. Cl.
CPC .............. *H01L 21/77* (2013.01); *H01L 27/12* (2013.01); *H01L 27/1259* (2013.01); *G02F 1/134309* (2013.01); *G02F 2001/136218* (2013.01)

(56) References Cited

U.S. PATENT DOCUMENTS

| 2008/0284962 | A1 | 11/2008 | Horiguchi et al. |
| 2009/0207366 | A1* | 8/2009 | Kim .................. G02F 1/134363 349/147 |
| 2014/0375534 | A1 | 12/2014 | Lee et al. |
| 2015/0364500 | A1 | 12/2015 | Cheng et al. |
| 2017/0153511 | A1 | 6/2017 | Um et al. |

FOREIGN PATENT DOCUMENTS

| CN | 101373301 A | 2/2009 |
| CN | 103676375 A | 3/2014 |
| CN | 103676390 A | 3/2014 |
| CN | 203883006 U | 10/2014 |
| CN | 203883006 U | 10/2014 |
| CN | Z03883006 U | 10/2014 |
| CN | 104916648 | 9/2015 |
| CN | 105185791 A | 12/2015 |
| CN | 204964957 U | 1/2016 |

OTHER PUBLICATIONS

International Search Report and Written Opinion in PCT/CN2016/073874 dated Jul. 5, 2016, with English translation. 14 pages.
"Second office action," CN Application No. 201510625592.0 (dated Mar. 19, 2018).
"Extended European Search Report," EP Application No. 16834167 (dated Apr. 2, 2019).

* cited by examiner ations No. 201510625592.0, filed on Sep. 28, 2015, the entire disclosures of which are incorporated herein by reference.

ARRAY SUBSTRATE AND MANUFACTURING METHOD THEREOF, DISPLAY DEVICE

RELATED APPLICATIONS

The present application is the U.S. national phase entry of PCT/CN2016/073874, with an international filing date of Feb. 16, 2016, which claims the benefit of Chinese Patent Applications No. 201510625592.0, filed on Sep. 28, 2015, the entire disclosures of which are incorporated herein by reference.

FIELD

The present disclosure generally relates to the field of display technologies. More particularly, the present disclosure relates to an array substrate and a manufacturing method thereof, and a display device.

BACKGROUND

With the development of thin film field effect transistor liquid crystal display (TFT-LCD) technology and the progress in industrial technology, the production cost of a liquid crystal display is reduced continuously while the manufacturing process thereof is improved increasingly, making it a mainstream technology in the flat panel display field in place of the cathode ray tube display. The TFT-LCD display becomes an ideal display device due to its advantages including small size, low power consumption, no radiation, and so on.

At present, the TFT-LCD can be classified into Twisted Nematic (TN) type, In Plane Switching (IPS) type and Advanced Super Dimension Switch (ADS) type in terms of display mode, wherein an ADS-type TFT-LCD usually forms a multi-dimensional electric field by an electric field generated at edges of slit electrodes on the same plane and an electric field generated between a slit electrode layer and a plate electrode layer, so that liquid crystal molecules at all orientation, which are located between the slit electrodes and directly above the electrodes in a liquid crystal cell, can be rotated, which enhances the work efficiency of liquid crystals and increases light transmittance. The ADS technology can improve the picture quality of TFT-LCD products, such that the display device has advantages of high resolution, high transmissivity, low power consumption, wide viewing angles, high aperture ratio, low chromatic aberration, no push Mura, etc.

SUMMARY

An objective of the present disclosure is to provide an array substrate for use in an ADS-type TFT-LCD and a manufacturing method thereof, which can at least alleviate or eliminate the problems existing in the prior art.

According to an aspect of the present disclosure, there is provided an array substrate, comprising a plurality of gate lines, a plurality of data lines that intersect the plurality of gate lines, and a plurality of pixel units defined by the plurality of gate lines and the plurality of data lines which intersect each other. Each pixel unit comprises a thin film transistor, a gate insulating layer, a passivation layer arranged on one side of the gate insulating layer, a pixel electrode and a common electrode, wherein a source and a drain of the thin film transistor are arranged between the passivation layer and the gate insulating layer, the common electrode is arranged on the other side of the gate insulating layer opposite to the passivation layer, and the pixel electrode is arranged on the passivation layer.

As compared to the prior art array substrate, in the array substrate provided by the present disclosure, by interchanging the positions of the pixel electrode and the common electrode, the pixel electrode is not arranged in the same layer as the common electrode line, thereby eliminating the need to set a spacing between the pixel electrode and the common electrode line to ensure that there is no crosstalk therebetween. The elimination of spacing improves the work efficiency of liquid crystals and further increases the transmittance of pixels.

According to an embodiment, the above array substrate may further comprise a shield electrode that is arranged in the same layer as the pixel electrode and located above the data lines.

When the data lines are applied with a voltage, an electric field generated by the data lines would cause that the liquid crystal molecules above and at two sides of the data lines cannot be deflected effectively, thereby resulting in light leakage. To address this problem, a shield electrode can be formed above the data lines for shielding the electric field generated by the data lines so as to prevent the electric field from affecting the effective deflection of the liquid crystal molecules. The inventor has found that, as compared to a black matrix having a width of at least 18-28 μm in the absence of a shield electrode, the width of the black matrix can be reduced to 6-8 μm in the presence of a shield electrode, thereby significantly increasing the aperture ratio of the display device.

According to another embodiment, the common electrode may have a matrix structure, the common electrode comprises a plurality of sub-common electrodes, and each pixel unit corresponds to one sub-common electrode. Optionally, the matrix structures of the common electrodes are connected via a common electrode line in a direction perpendicular to the data lines, and the common electrodes are electrically connected to the common electrode line by means of direct contact. Moreover, optionally, the matrix structures of the common electrodes are connected via a connection electrode in a direction parallel to the data lines, the connection electrode and the common electrode are arranged in different layers, and the connection electrode is connected to adjacent sub-common electrodes via a via hole, respectively. Specifically, the via holes are made in the gate insulating layer and the passivation layer.

According to an embodiment, the shield electrodes are connected to each other via a shield electrode connecting line in a direction perpendicular to the data lines, wherein the shield electrode and the shield electrode connecting line are formed of the same material.

According to a further embodiment, the shield electrode and the common electrode may be connected to a same common electrode line. Alternatively, the shield electrode and the common electrode may be connected to different common electrode lines, and signals on different common electrode lines may be the same or different. When the signals on different common electrode lines are different, a small signal input can be added to make the signals in the shield electrode and the common electrode slightly different.

According to an embodiment, the shield electrode and the common electrode may be electrically insulated from each other, and connected to different common electrode lines. At that time, the common electrode is not affected by a parasitic capacitance between the shield electrode and the data lines.

According to yet another embodiment, since the pixel electrode is usually made of ITO having large resistivity, the array substrate may further comprise a pixel metal electrode corresponding to the pixel electrode in order to prevent signals in the pixel electrode from being deteriorated due to the large resistance of ITO. An insulating layer may be present between the pixel electrode and the pixel metal electrode, and the pixel electrode and the pixel metal electrode are connected to each other via a via hole in the insulating layer.

According to a further embodiment, the pixel electrode is a slit electrode, while the common electrode is a plate electrode. Accordingly, a multi-dimensional electric field can be formed by an electric field generated at edges of the slit electrodes and an electric field generated between the slit electrode layer and the plate electrode layer, so that liquid crystal molecules at all orientation, which are located between the slit electrodes and directly above the electrodes in the liquid crystal cell, can be rotated, which enhances the work efficiency of liquid crystals and increases light transmittance.

According to another aspect of the present disclosure, there is provided a display device comprising the array substrate as described above. By interchanging the positions of the pixel electrode and the common electrode, the pixel electrode is no longer arranged in the same layer as the common electrode line, thereby eliminating the need to set a spacing between the pixel electrode and the common electrode line to ensure that there is no crosstalk therebetween. The elimination of spacing improves the work efficiency of liquid crystals and further increases the transmittance of pixels.

According to yet another aspect of the present disclosure, there is provided a method for manufacturing the array substrate as described above, comprising steps of: forming, on a base substrate, a pattern comprising a gate of a thin film transistor, a common electrode and a common electrode line; forming a gate insulating layer; forming an active layer of the thin film transistor; forming a pattern comprising a source, a drain of the thin film transistor and data lines; forming a passivation layer, wherein the source and the drain of the thin film transistor are arranged between the passivation layer and the gate insulating layer; and forming a pixel electrode on the passivation layer.

According to an embodiment of the present disclosure, the above method may further comprise forming a shield electrode on the passivation layer, wherein the shield electrode is arranged in the same layer as the pixel electrode and located above the data lines. The shield electrode can shield an electric field generated by the data lines so as to prevent the electric field from affecting an effective deflection of the liquid crystal molecules.

According to another embodiment of the present disclosure, the above method may further comprise forming a pixel metal electrode over the pixel electrode, an insulating layer being present between the pixel electrode and the pixel metal electrode, the pixel electrode being connected to the pixel metal electrode via a via hole in the insulating layer. Since the pixel electrode is usually made of ITO having large resistivity, the addition of the pixel metal electrode can prevent signals in the pixel electrode from being deteriorated due to the large resistance of ITO.

BRIEF DESCRIPTION OF DRAWINGS

These and other aspects of the present disclosure would become apparent from embodiments described below, and these and other aspects of the present disclosure will be set forth with reference to the embodiments described below. In the drawings, FIG. 1 schematically illustrates a cross-sectional view of a prior art array substrate.

DETAILED DESCRIPTION

Figure 1:
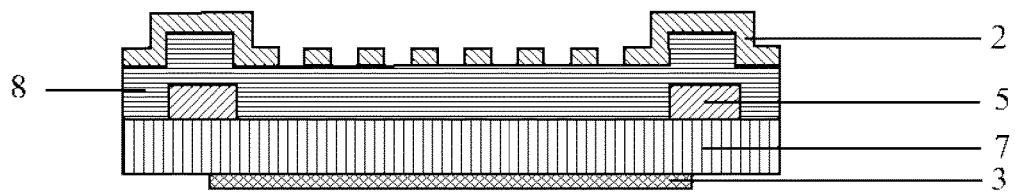

FIG. 1 illustrates a schematic cross-sectional view of a prior art ADS-type array substrate. As shown in FIG. 1, the array substrate successively comprises, from bottom to top, a pixel electrode 3, a gate of a thin film transistor and a common electrode line pattern (not shown) which are arranged in the same layer; a gate insulating layer 7; a passivation layer 8; a source, a drain of the thin film transistor and a data line pattern 5; and a common electrode 2. Accordingly, a method for manufacturing an existing ADS-type array substrate generally comprises: forming, on a transparent substrate, a pixel electrode, a gate of the thin film transistor and a common electrode line pattern which are arranged in the same layer; forming a gate insulating layer; forming an active layer pattern; forming a source, a drain of the thin film transistor and a data line pattern; forming a passivation layer; and forming a common electrode over the passivation layer.

Figure 2:
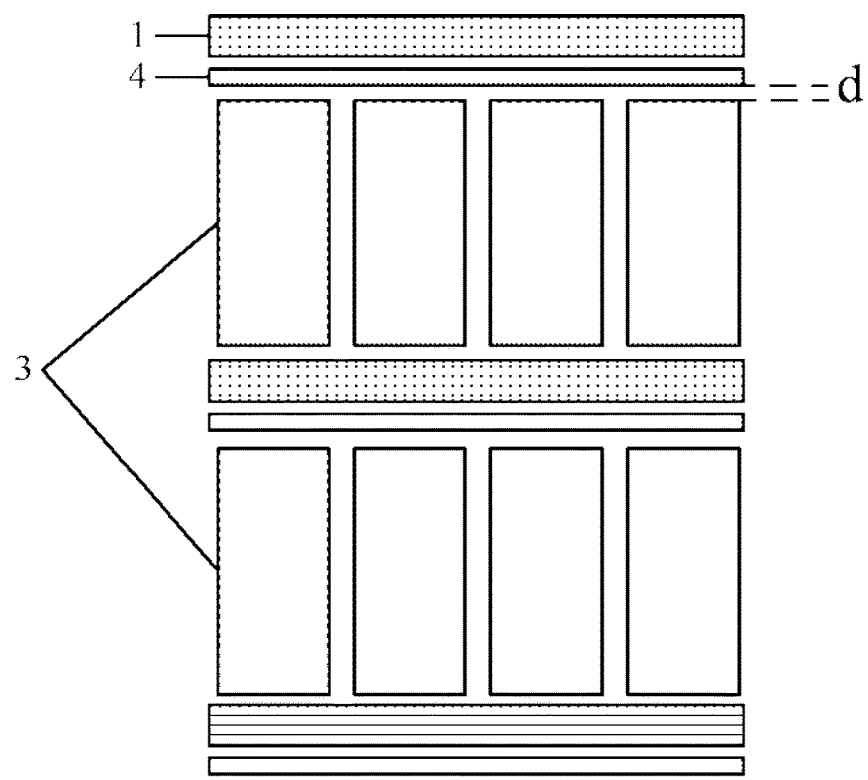
FIG. 2 schematically illustrates a top view of a prior art array substrate.

A problem arising in the array substrate shown in FIG. 1 is that, as shown in FIG. 2, the common electrode line 4 and the pixel electrode 3 arranged in the same layer as the gate 1 of the thin film transistor are connected to different signal lines, thus it is required to set a certain spacing d therebetween so as to ensure that there is no crosstalk between signals in the common electrode line 4 and the pixel electrode 3. The spacing between the common electrode line 4 and the pixel electrode 3 decreases the work efficiency of liquid crystals in corresponding portions and in turn decreases the transmittance of pixels.

Figure 3:
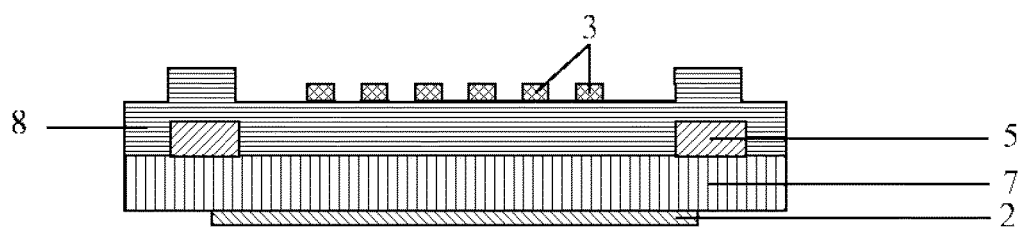
FIG. 3 schematically illustrates a cross-sectional view of an array substrate according to an embodiment of the present disclosure.
Figure 4:
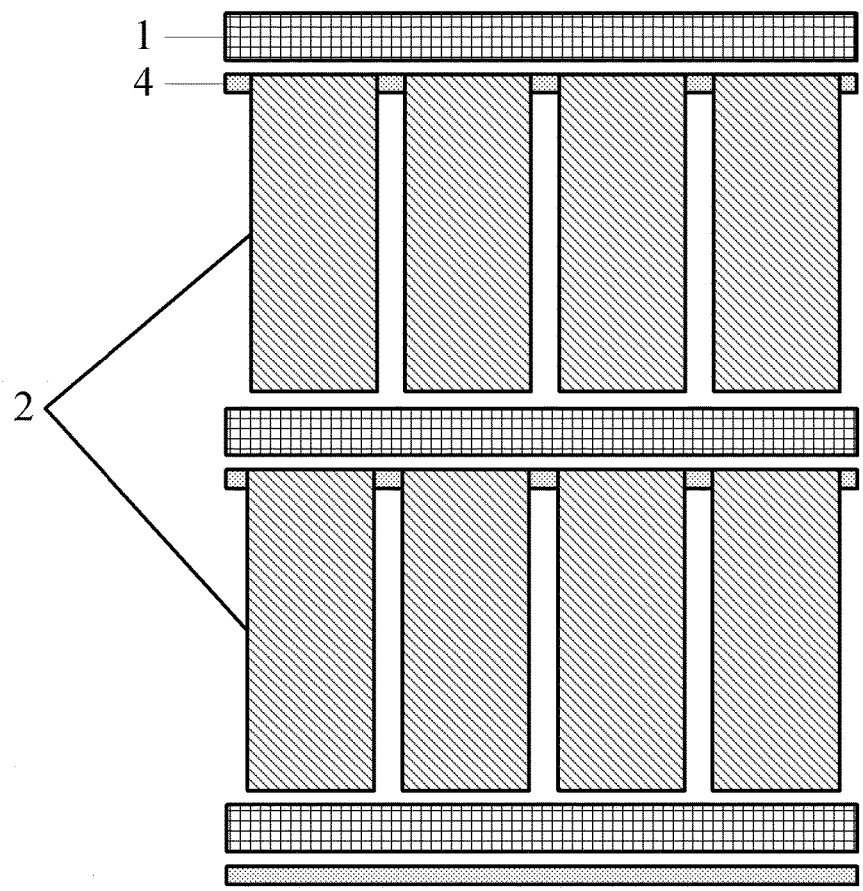
FIG. 4 schematically illustrates a top view of an array substrate according to an embodiment of the present disclosure.

FIGS. 3 and 4 illustrate a cross-sectional view and a top view of an array substrate according to an embodiment of the present disclosure respectively. The array substrate according to an embodiment of the present disclosure comprises a plurality of gate lines, a plurality of data lines that intersect the plurality of gate lines, and a plurality of pixel units defined by the plurality of gate lines and the plurality of data lines which intersect each other. Each of the pixel units comprises a thin film transistor, a gate insulating layer 7, a passivation layer 8 arranged on one side of the gate insulating layer 7, a pixel electrode 3 and a common electrode 2, wherein the source and the drain 5 of the thin film transistor are arranged between the passivation layer 8 and the gate insulating layer 7, the common electrode 2 is arranged on the other side of the gate insulating layer 7 opposite to the passivation layer 8, and the pixel electrode 3 is arranged on the passivation layer 8.

As compared to the prior art array substrate shown in FIG. 1, in the above array substrate, by interchanging the positions of the pixel electrode 3 and the common electrode 2, that is, as shown in FIG. 3, arranging the pixel electrode 3 above the passivation layer 8 and arranging the common electrode 2 below the gate insulating layer 7 (which is contrary to the arrangement of FIG. 1 in which the pixel electrode 3 is arranged below the gate insulating layer 7 and the common electrode 2 is arranged above the passivation layer 8), the pixel electrode 3 is no longer arranged in the same layer as a common electrode line 4, thereby eliminating the need to set a spacing between the pixel electrode 3 and the common electrode line 4 so as to ensure that there is no crosstalk therebetween. As shown in FIG. 4, there may be no spacing between the common electrode 2 and the common electrode line 4, or even they may overlap each other. The elimination of spacing improves the work efficiency of liquid crystals and further increases the transmittance of pixels.

Figure 5:
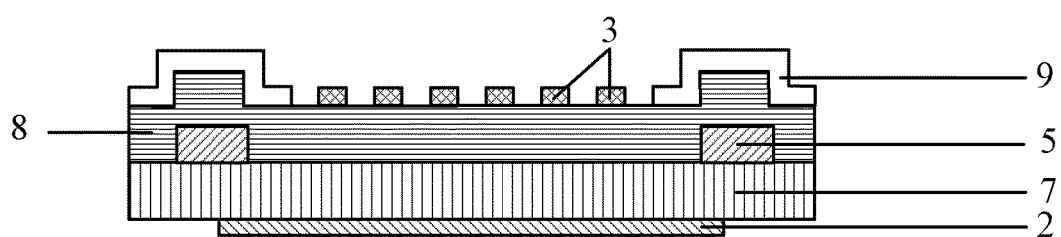
FIG. 5 schematically illustrates a cross-sectional view of an array substrate according to another embodiment of the present disclosure.

FIG. 5 illustrates a cross-sectional view of an array substrate according to another embodiment of the present disclosure. FIG. 5 is different from FIG. 3 in that the array substrate further comprises a shield electrode 9 arranged in the same layer as the pixel electrode 3 and located above the data line 5.

The shield electrode 9 located above the data line 5 can shield an electric field generated by the data line 5, thereby preventing the electric field from affecting an effective deflection of the liquid crystal molecules. In the absence of the shield electrode 9, the width of a black matrix is at least 18 to 28 μm, whereas in the presence of the shield electrode 9, the width of the black matrix can be reduced to 6 to 8 μm, thereby significantly increasing the aperture ratio of the display device.

Figure 6:
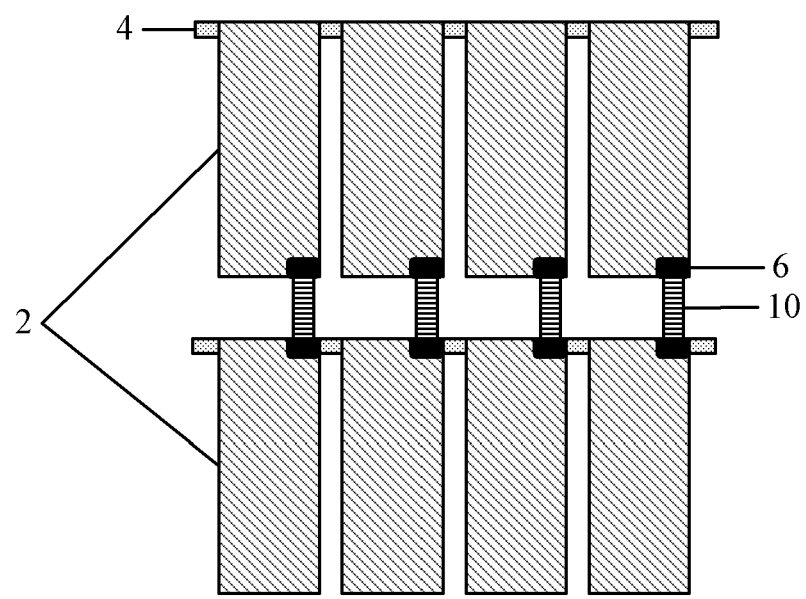
FIG. 6 schematically illustrates a matrix structure design of common electrodes according to an embodiment of the present disclosure.
Figure 7:
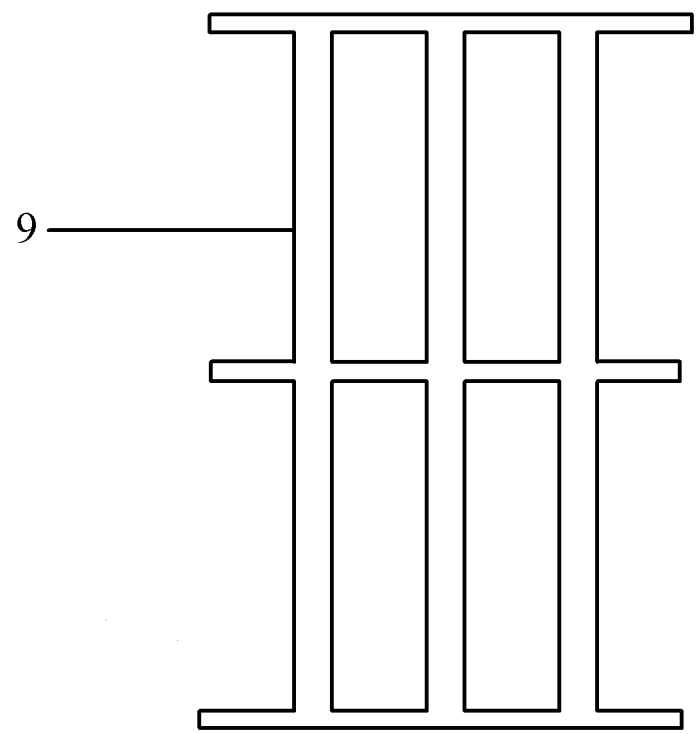
FIG. 7 schematically illustrates a structural design of shield electrodes according to an embodiment of the present disclosure.

According to an embodiment, the common electrode may have a matrix structure, the common electrode comprises a plurality of sub-common electrodes, and each pixel unit corresponds to one sub-common electrode. FIGS. 6 and 7 illustrate a structural design of a common electrode and a shield electrode according to an embodiment, respectively. As shown in FIG. 6, the matrixes of the common electrodes 2 are connected by a common electrode line 4 in a direction perpendicular to the data lines, and the common electrode 2 is electrically connected to the common electrode line 4 by means of direct contact. The matrixes are connected by a connection electrode 10 in a direction parallel to the data lines, the connection electrode 10 and the common electrode 2 are arranged in different layers, and the connection electrode 10 is connected to adjacent sub-common electrodes via via holes 6, respectively. Specifically, the connection electrode 10 is connected to the adjacent sub-common electrodes via the via holes 6 made in the gate insulating layer and the passivation layer.

Similarly, as shown in FIG. 7, the shield electrodes 9 are mutually connected via a shield electrode connecting line in a direction perpendicular to the data lines, and the shield electrode 9 and the shield electrode connecting line are formed of the same material such as indium tin oxide (ITO).

In the array substrate proposed by the present disclosure, the shield electrode and the common electrode may be connected to the same common electrode line. Alternatively, the shield electrode and the common electrode may be connected to different common electrode lines, and signals on different common electrode lines may be the same or different. When the signals on different common electrode lines are different, a small signal input can be added to make the signals in the shield electrode and the common electrode slightly different.

According to an embodiment, the shield electrode and the common electrode may be electrically insulated from each other and connected to different common electrode lines. At that time, the common electrode is not affected by a parasitic capacitance between the shield electrode and the data lines.

According to an embodiment, since the pixel electrode is usually made of ITO having large resistivity, the array substrate may further comprise a pixel metal electrode corresponding to the pixel electrode in order to prevent signals in the pixel electrode from being deteriorated due to the large resistance of ITO. An insulating layer may be present between the pixel electrode and the pixel metal electrode, and the pixel electrode and the pixel metal electrode are connected to each other via a via hole in the insulating layer.

As shown in FIGS. 3 and 5, the pixel electrode 3 is a slit electrode, and the common electrode 2 is a plate electrode. Accordingly, a multi-dimensional electric field can be formed by an electric field generated at edges of the slit electrodes and an electric field generated between the slit electrode layer and the plate electrode layer, so that liquid crystal molecules at all orientation, which are located between the slit electrodes and directly above the electrodes in a liquid crystal cell, can be rotated, which enhances the work efficiency of liquid crystals and increases light transmittance.

Figure 8:
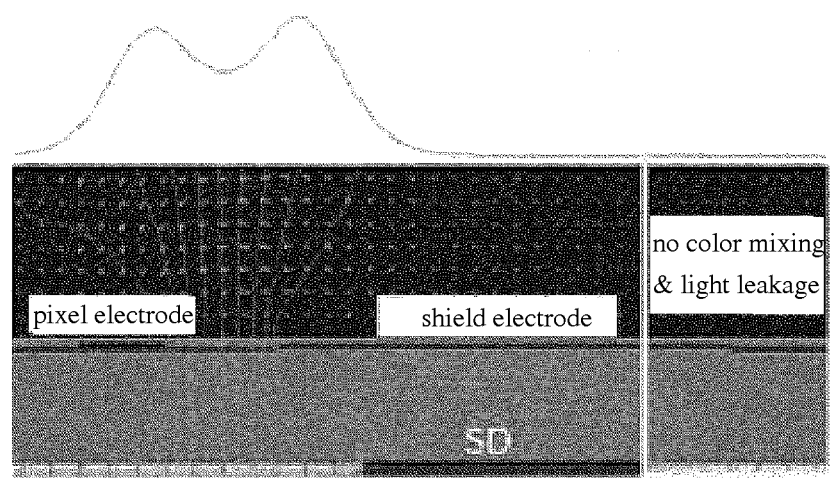
FIG. 8 illustrates a simulation result of analysis of crosstalk between a pixel electrode and a shield electrode.

In the array substrate proposed by the present disclosure, the pixel electrode and the shield electrode are arranged in the same layer and connected to different signal lines. To demonstrate that there is no crosstalk between signals of the pixel electrode and the shield electrode such that light leakage and color mixing would not take place, the array substrate shown in FIG. 5 is simulated. The simulation result is shown in FIG. 8 which is a vertical sectional view of the pixel map. As can be seen from FIG. 8, color mixing and light leakage do not take place in the block when the left side portion of the block is lit. In consequence, the arrangement of the pixel electrode and the shield electrode in the same layer would not cause crosstalk between signals or cause leakage and color mixing.

The present disclosure further provides a display device comprising the array substrate as described above. By interchanging the positions of the pixel electrode and the common electrode, the pixel electrode and the common electrode line are no longer arranged in the same layer, thereby eliminating the need to set a spacing between the pixel electrode and the common electrode line to ensure that there is no crosstalk therebetween. The elimination of spacing enhances the work efficiency of liquid crystals and further increases the transmittance of pixels.

The display device provided by the present disclosure may be a liquid crystal display device of any mode such as TN, ADS, IPS, LTPS, and the like. The display device may be any product or component having display function, such as a liquid crystal panel, a liquid crystal television, a display, a mobile phone, a navigator, and so on.

Figure 9:
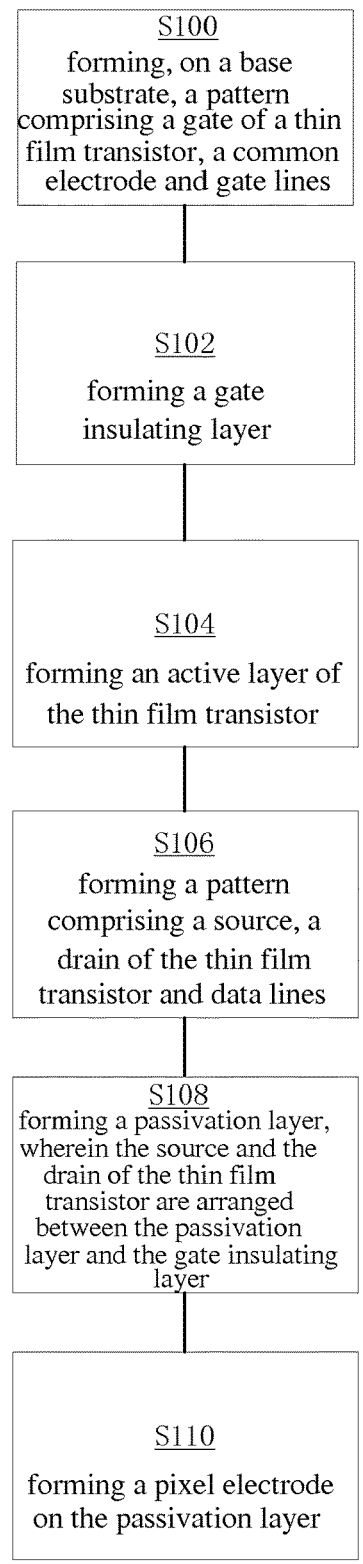
FIG. 9 is a flowchart of a method for manufacturing an array substrate according to an embodiment of the present disclosure.

FIG. 9 illustrates a flowchart of a method for manufacturing the array substrate as described above according to an embodiment of the present disclosure. Specifically, the method comprises the steps of:

at S100, forming, on a base substrate, a pattern comprising a gate of a thin film transistor, a common electrode and a common electrode line; at S102, forming a gate insulating layer; at S104, forming an active layer of the thin film transistor; at S106, forming a pattern comprising a source, a drain of the thin film transistor and data lines; at S108, forming a passivation layer, wherein the source and the drain of the thin film transistor are arranged between the passivation layer and the gate insulating layer; and at S110, forming a pixel electrode on the passivation layer.

Specifically, step S100 may comprise first forming a metal layer on the base substrate, patterning the metal layer, thereby forming a pattern comprising a gate, a common electrode, and a common electrode line. The base substrate is a transparent substrate, for example, a glass substrate, a quartz substrate, and an organic resin substrate. The metal layer may be deposited on the base substrate by sputtering or thermal evaporation, wherein the gate metal layer may be a metal such as Cu, Al, Ag, Mo, Cr, Nd, Ni, Mn, Ti, Ta, W or the like and an alloy of these metals, and the metal layer may be a monolayer structure or a multilayer structure such as Cu\Mo, Ti\Cu\Ti, Mo\Al\Mo or the like. Patterning methods include photolithography, wet etching, dry etching, and so on. The common electrode can also be made by depositing an indium tin oxide (ITO) material.

In step S102, the material of the gate insulating layer may be selected from oxides, nitrides or oxynitrides, and may be a monolayer, a double-layer or a multilayer structure. In particular, the material of the gate insulating layer may be SiNx, SiOx or Si(ON)x.

Step S104 may specifically comprises forming a semiconductor layer, patterning the semiconductor layer to form an active layer pattern of the thin film transistor. The material of the active layer may be a silicon semiconductor or a metal oxide semiconductor.

Step S106 may specifically comprise forming a metal layer on the base substrate where step S104 has been completed, patterning the metal layer to form a pattern comprising a source, a drain of the thin film transistor and data lines.

In step S108, the material of the passivation layer may be selected from oxides, nitrides or oxynitrides, and may be a monolayer, a double-layer or a multilayer structure. For example, the material of the passivation layer may be SiNx, SiOx or Si(ON)x.

In step S110, the pixel electrode may be made by depositing an indium tin oxide (ITO) material.

According to an embodiment of the present disclosure, the above method may further comprise forming a shield electrode on the passivation layer, wherein the shield electrode is located above the data lines. The shield electrode can shield an electric field generated by the data lines, thereby preventing the electric field from affecting an effective deflection of liquid crystal molecules.

Although the present disclosure is illustrated and described in detail in the drawings and the aforegoing description, such illustration and description shall be regarded to be illustrative or exemplary rather than limiting. The present disclosure is not limited to the disclosed embodiments. At the time of practicing the claimed disclosure, those skilled in the art can understand and implement other variations of the disclosed embodiments by studying the drawings, disclosures and enclosed claims. For example, the above described method does not require the desired results to be achieved in the specific order or sequence as described. Other steps can be provided or steps can be removed from the described method, and other components can be added to the described device or components can be removed from the described device. Other embodiments may fall within the scope of the present disclosure.

The invention claimed is:

1. An array substrate, comprising:
   a plurality of gate lines;
   a plurality of data lines that intersect the plurality of gate lines;
   a plurality of pixel units defined by the plurality of gate lines and the plurality of data lines which intersect each other, each pixel unit comprising a thin film transistor, a gate insulating layer, a passivation layer arranged on one side of the gate insulating layer, a pixel electrode and a common electrode; and
   a shield electrode arranged in the same layer as the pixel electrode and located above the data lines,
   wherein
   a source and a drain of the thin film transistor are arranged between the passivation layer and the gate insulating layer,
   the common electrode is arranged on the other side of the gate insulating layer opposite to the passivation layer,
   the pixel electrode is arranged on the passivation layer, and
   the array substrate further comprises a pixel metal electrode corresponding to the pixel electrode, an insulating layer is present between the pixel electrode and the pixel metal electrode, and the pixel electrode and the pixel metal electrode are mutually connected via a via hole in the insulating layer, the shield electrode and the common electrode are electrically insulated from each other, and connected to different common electrode lines.

2. The array substrate according to claim 1, wherein the common electrode comprises one of a plurality of sub-common electrodes, the plurality of sub-common electrodes are arranged in a matrix structure, and each pixel unit corresponds to one sub-common electrode.

3. The array substrate according to claim 2, wherein the plurality of sub-common electrodes in the matrix structure are connected via a common electrode line in a direction perpendicular to the data lines, and are electrically connected to the common electrode line by means of direct contact.

4. The array substrate according to claim 3, wherein the plurality of sub-common electrodes in the matrix structure are connected via a connection electrode in a direction parallel to the data lines, the connection electrode and the common electrode are arranged in different layers, and the connection electrode is connected to adjacent sub-common electrodes via a via hole, respectively.

5. The array substrate according to claim 1, wherein a plurality of shield electrodes comprising the shield electrode are connected to each other via a shield electrode connecting line in a direction perpendicular to the data lines, wherein the plurality of shield electrodes and the shield electrode connecting line are formed of the same material.

6. The array substrate according to claim 1, wherein the pixel electrode is a slit electrode, and the common electrode is a plate electrode.

7. A display device comprising an array substrate, the array substrate comprising:
   a plurality of gate lines;

a plurality of data lines that intersect the plurality of gate lines;

a plurality of pixel units defined by the plurality of gate lines and the plurality of data lines which intersect each other, each pixel unit comprising a thin film transistor, a gate insulating layer, a passivation layer arranged on one side of the gate insulating layer, a pixel electrode and a common electrode; and a shield electrode arranged in the same layer as the pixel electrode and located above the data lines, wherein a source and a drain of the thin film transistor are arranged between the passivation layer and the gate insulating layer, the common electrode is arranged on the other side of the gate insulating layer opposite to the passivation layer, the pixel electrode is arranged on the passivation layer, and the array substrate further comprises a pixel metal electrode corresponding to the pixel electrode, an insulating layer is present between the pixel electrode and the pixel metal electrode, and the pixel electrode and the pixel metal electrode are mutually connected via a via hole in the insulating layer, wherein the shield electrode and the common electrode are electrically insulated from each other, and connected to different common electrode lines.

8. The display device according to claim 7, wherein the common electrode comprises one of a plurality of sub-common electrodes, the plurality of sub-common electrodes are arranged in a matrix structure, and each pixel unit corresponds to one sub-common electrode.

9. The display device according to claim 8, wherein the plurality of sub-common electrodes in the matrix structure are connected via a common electrode line in a direction perpendicular to the data lines, and are electrically connected to the common electrode line by means of direct contact.

10. The display device according to claim 9, wherein the plurality of sub-common electrodes in the matrix structure are connected via a connection electrode in a direction parallel to the data lines, the connection electrode and the common electrode are arranged in different layers, and the connection electrode is connected to adjacent sub-common electrodes via a via hole, respectively.

11. The display device according to claim 7, wherein a plurality of shield electrodes comprising the shield electrode are connected to each other via a shield electrode connecting line in a direction perpendicular to the data lines, wherein the plurality of shield electrodes and the shield electrode connecting line are formed of the same material.

* * * * *